United States Patent [19]

Hanson

[11] 4,305,063
[45] Dec. 8, 1981

[54] AUTOMATIC DIGITAL GAIN RANGING SYSTEM

[75] Inventor: Edmund G. Hanson, Center Moriches, N.Y.

[73] Assignee: Grumman Aerospace Corp., Bethpage, N.Y.

[21] Appl. No.: 29,465

[22] Filed: Apr. 12, 1979

Related U.S. Application Data

[63] Continuation-in-part of Ser. No. 774,615, Mar. 4, 1977, abandoned.

[51] Int. Cl.³ ............................................. H03K 13/24
[52] U.S. Cl. ............................................. 340/347 DD
[58] Field of Search .................. 340/347 DD; 235/310

[56] References Cited

U.S. PATENT DOCUMENTS

| | | | |
|---|---|---|---|
| 2,827,233 | 3/1958 | Johnson | 340/347 M |
| 2,981,107 | 4/1961 | Anderson | 324/115 |
| 3,133,278 | 5/1964 | Millis | 340/347 AD |
| 3,187,323 | 6/1965 | Flood | 340/347 AD |
| 3,577,076 | 5/1971 | Frushour | 324/115 |
| 3,582,777 | 6/1971 | Wunderman | 324/115 |
| 3,648,175 | 3/1972 | Barnard | 324/115 |
| 3,694,639 | 9/1972 | Deschenes | 340/347 DD |
| 3,711,774 | 1/1973 | Bohler | 324/115 |
| 3,728,625 | 4/1973 | Senour | 324/99 D |
| 3,826,983 | 7/1974 | Garratt | 324/99 D |
| 4,062,014 | 12/1977 | Rothgordt | 340/347 DD |

FOREIGN PATENT DOCUMENTS 2312128  9/1974  Fed. Rep. of Germany ...... 340/347 DD Primary Examiner—Charles D. Miller
Attorney, Agent, or Firm—Morgan, Finnegan, Pine, Foley & Lee

[57] ABSTRACT

An automatic digital gain ranging system wherein the zeros are eliminated preceding the most significant non-zero bit and the shortened encoded word that results includes a gain code designation according to the number of zeros eliminated plus a predetermined number of data bits determined in accordance with the position of the most significant nonzero bit.

4 Claims, 16 Drawing Figures

| $i_1$ | $i_2$ | $i_3$ | $i_4$ | $i_5$ | $i_6$ | $i_7$ | $i_8$ | $i_9$ | $i_{10}$ | $i_{11}$ | $i_{12}$ | $i_{13}$ | $i_{14}$ | $i_{15}$ |
|---|---|---|---|---|---|---|---|---|---|---|---|---|---|---|
| 1 | 0 | 1 | 0 | 0 | 1 | 1 | 1 | 0 | 1 | 0 | 0 | 0 | 0 | 0 |

$f + \bar{e} + \bar{d} + \bar{c} + \bar{b} + \bar{a} = M_f$

| | | ↓ | ↓ | ↓ | ↓ | ↓ | ↓ | ↓ | ↓ | | | | | |
|---|---|---|---|---|---|---|---|---|---|---|---|---|---|---|
| | | 1 | 0 | 0 | 1 | 1 | 1 | 0 | 1 | 0 | 1 | 0 | | |
| | | $d_1$ | $d_2$ | $d_3$ | $d_4$ | $d_5$ | $d_6$ | $d_7$ | $d_8$ | $g_1$ | $g_2$ | $g_3$ | | |

| | $g_1$ | $g_2$ | $g_3$ | GAIN MULTIPLIER | DATA LSB($d_1$) | BITS MSB($d_7$) | DECODE BITS |
|---|---|---|---|---|---|---|---|
| Ma | 1 | 1 | 1 | 128 | $i_8$ | $i_{14}$ | 1 |
| Mb | 0 | 1 | 1 | 64 | $i_7$ | $i_{13}$ | 10 |
| Mc | 1 | 0 | 1 | 32 | $i_6$ | $i_{12}$ | 100 |
| Md | 0 | 0 | 1 | 16 | $i_5$ | $i_{11}$ | 1000 |
| Me | 1 | 1 | 0 | 8 | $i_4$ | $i_{10}$ | 10000 |
| Mf | 0 | 1 | 0 | 4 | $i_3$ | $i_9$ | 100000 |
| Mg | 1 | 0 | 0 | 2 | $i_2$ | $i_8$ | 1000000 |
| Mh | 0 | 0 | 0 | 1 | $i_2$ | $i_8$ | 0000000 |

AUTOMATIC DIGITAL GAIN RANGING SYSTEM

CROSS REFERENCE TO RELATED APPLICATION

This application is a continuation-in-part of application Ser. No. 774,615, filed Mar. 4, 1977, now abandoned.

BACKGROUND OF THE INVENTION

This invention relates to automatic gain ranging methods and apparatus and, more particularly, to systems wherein gain ranging is achieved through digital processing.

There are many examples where systems must be designed to cover an extremely broad range of measured values. For example, in a space vehicle docking maneuver, range data may be required for a distance of about three miles down to a few hundred feet where the final docking procedure takes over. At a range of a hundred feet a resolution of $\pm\frac{1}{2}$ foot is required. In order to provide this resolution and range data up to three miles in the same system, a full fifteen bit code providing an excess of 32,000 increments would be required.

In the past automatic range control systems have been constructed as part of the analog measuring devices which have the effect of reducing the required digital word size. Typically, such systems include a device for determining when the measurement goes "off scale" and to then automatically change to a different scale. The fianl signal from such a device can include both the measured "on scale" value plus a code signal indicating which scale was used for obtaining the measurement.

The scale changing analog systems suffer the disadvantages of being slow, subject to drift, and poorly suited for integrated, low cost mass production. With such systems it is normally necessary to attempt a measurement and, if it goes "off scale", to then make a gain correction, another measurement, etc., until an "on scale" measurement is achieved. Also, in many of the prior analog gain changing systems using operational amplifiers, the initial "off scale" measurement would drive the operational amplifier into saturation causing further lost time while the amplifier comes out of saturation to prepare for the next measurement.

BRIEF DESCRIPTION OF THE INVENTION

The system according to this invention includes a digital processor which provides automatic gain ranging without requiring any analog scale changing.

All incoming measurements are formatted to a standard word size including sufficient digits to cover the entire range of measurements with the desired least bit resolution. For example, if a 15 bit word size is selected, then any incoming measurement can be specified according to 32,768 increments. In the case of space vehicle ranging, a 15 bit word size can indicate range up to three miles and resolution better than $\pm\frac{1}{2}$ foot over the entire range.

Digital processing according to the invention eliminates the zeros in the most significant bit positions and derives a gain code designation corresponding to the number of zeros eliminated. The system then selects as data bits the most significant nonzero bit and a predetermined number of successively lesser bits. In the case of an incoming 15 bit word it is convenient to use a three bit gain code (to provide eight different gain designations) and eight data bits. Thus, the outgoing data would always be in an eleven bit format.

With this system, least bit resolution is sacrificed when large signals are present but is automatically regained as the signal approaches zero. High resolution is seldom needed when signals approach full scale because such a high degree of resolution and accuracy is normally beyond the measuring capability of the sensing device or the needs of the system. For example, in space vehicle ranging, while resolution of $\pm\frac{1}{2}$ foot may be required at a range of 100 feet, $\pm50$ feet is usually more adequate at a range of several miles. Thus, the lost resolution on large signals is not usually significant.

A particular advantage of the digital processing system according to this invention lies in the fact that one processor can handle signals coming from a high speed multiplex of transducers or measuring devices having a wide range of full scale outputs without requiring premultiplex amplitude standardizing signal conditioners. In each case the incoming data word would be converted into a signal including the most significant data bits plus a gain code designation. In the case of a three bit gain code, the full scale values could cover a range of 128 to 1 and still all be transmitted in a common telemetry system using the same format. At the receiving end, the data, if desired, can be returned to the original data format regardless of which transducer or measuring device originated the data.

A particularly advantageous embodiment of the invention is a digital processor in which not only the zeros in the most significant bit portions are eliminated, but also the most significant "1" bit is eliminated. The gain code indicates the number of zeros eliminated and also indicates the position of the most significant "1" bit since it always follows the zeros that have been eliminated. A predetermined number of lesser bits following the bits that have been eliminated are then encoded together with the gain code. With this arrangement an incoming 15 bit word can be encoded using a three bit gain code plus seven data bits so that the outgoing word is in a ten bit format. For most encoded words this ten bit outgoing word carries all the intelligence contained in the eleven bit format previously described wherein only the most significant zeros are eliminated while encoding.

DESCRIPTION OF PREFERRED EMBODIMENTS

Figure 1:
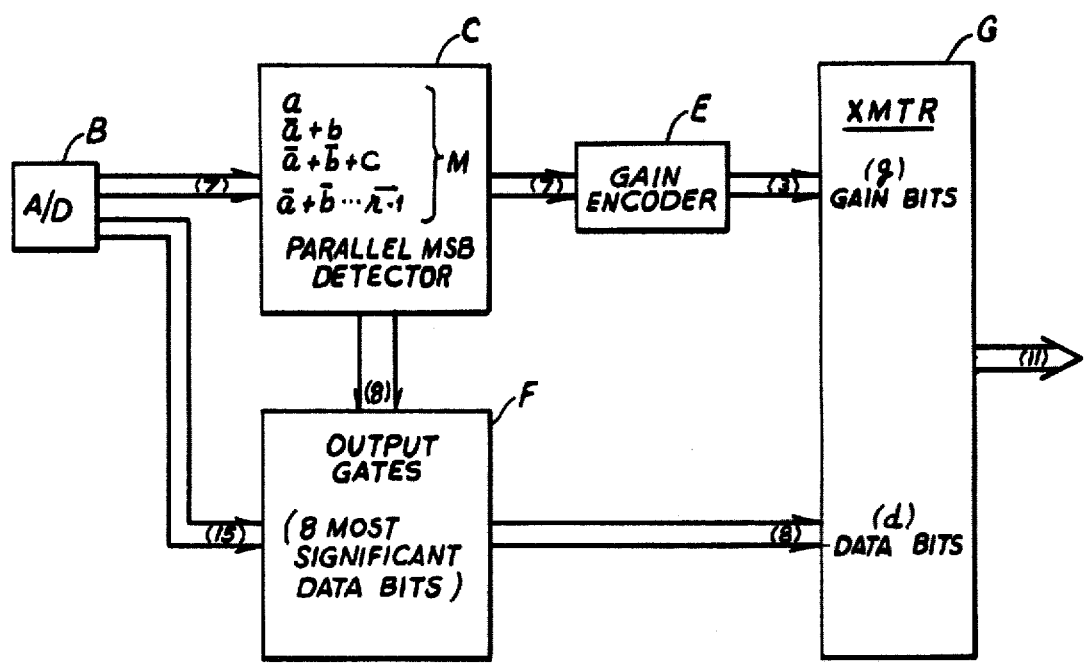
FIG. 1 is a block diagram illustrating a parallel digital encoding processor according to the present invention.

FIG. 1 is a block diagram illustrating the digital encoding processor according to the invention used to convert a fifteen bit incoming word to an eleven bit encoded word including a three bit gain code and eight data bits. The incoming word can originate from any source, typically a measuring device coupled through a time division multiplexer to an analog to digital (A to D) converter B. A parallel most significant bit (MSB) detector C is connected to receive the seven most significant incoming bits to determine therefrom the location of the most significant nonzero bit or the lack thereof. The gain encoder E is an octal to binary converter which provides a three bit gain code designation corresponding to the location of the most significant nonzero bit. The output gates F are connected to receive the fifteen bit incoming word and transfer it to a transmitting device G the eight bits including the most significant nonzero bit together with the next seven lesser bits. The output gates are controlled by the MSB detector C. The transmitting device G can be part of a telemetry system capable of transmitting words in an 11 bit serial format or it can be simply a series of conductors conveying the eleven bit word to the input of a data processing system.

Figure 2:
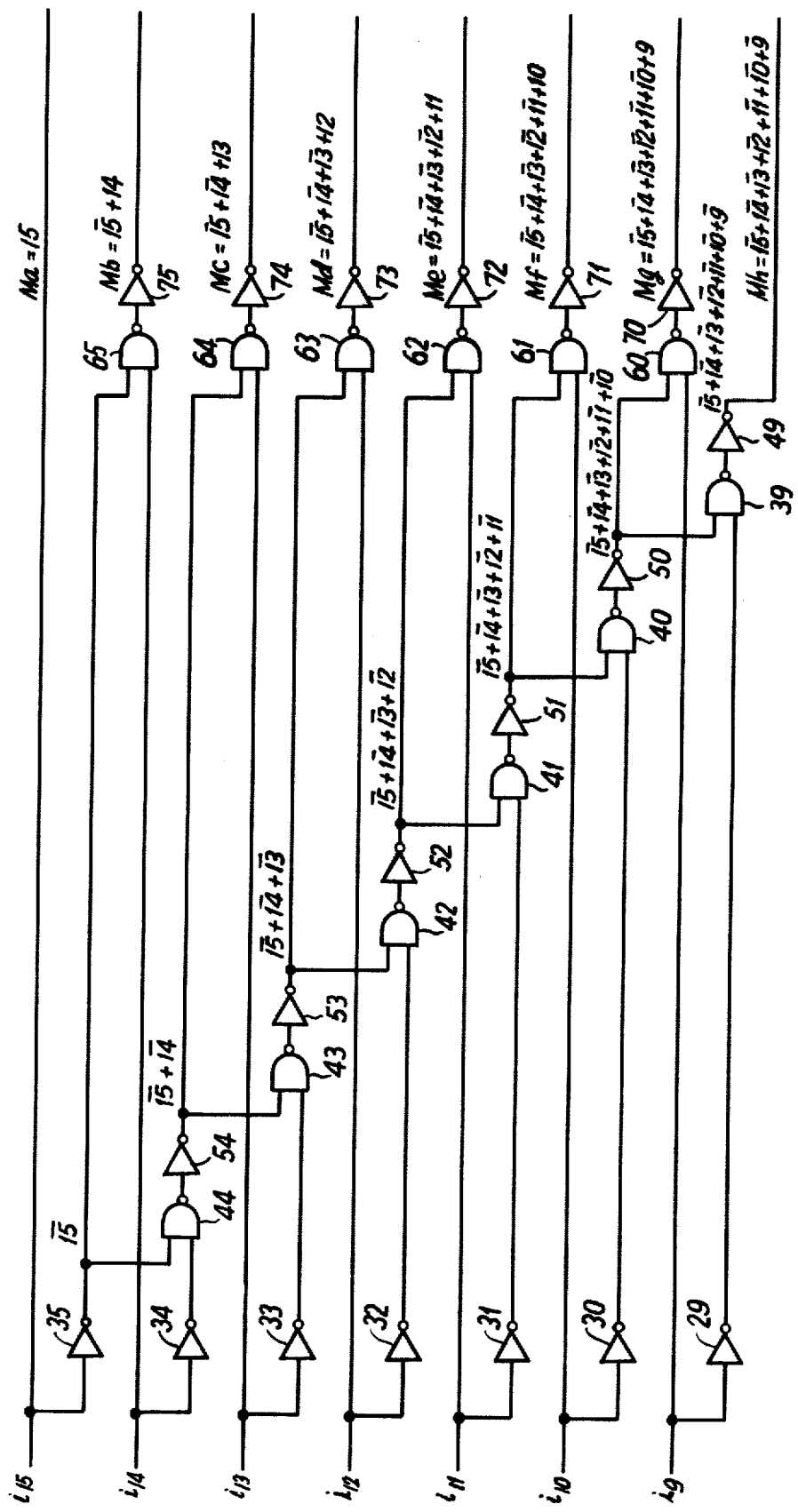
FIG. 2 is a schematic diagram of logic circuitry forming a parallel MSB detector for the encoding processor.

The logic circuit configuration for the MSB detector is illustrated in FIG. 2. The general algorithm for the MSB detector is as follows:

$M_a = a$
$M_b = \bar{a} + b$
$M_c = \bar{a} + \bar{b} + c$
$M_{r-1} = \bar{a} + \bar{b} + \bar{c} \cdot r - 1$
$M_r = \bar{a} + \bar{b} + \bar{c} \cdot \bar{r-1}$.

In the algorithm, "a" is the most significant bit and "b", "c"... "r" are successively lesser bits. $M_a$ indicates that the most significant bit "a" is nonzero, $M_b$ indicates that the second most significant bit "b" is the most significant nonzero bit, etc. The number of bits examined in the MSB detector is "r−1" which is limited by the number of gain code bits "n" where: $r = 2^n$. Thus, with the illustration of FIG. 1 wherein a three bit gain code is employed, r is equal to eight.

With this example, if one of the seven most significant bits is a "1", then one of the expressions $M_a$ through $M_g$ will be in the "true" state. If none of the seven most significant bits is in the "1" state then $M_h$ ($M_r$) is "true".

In FIG. 2 the seven most significant bits of the fifteen bit incoming word are supplied to the terminals $i_{15}$–$i_9$. The terminals $i_9$–$i_{15}$ are connected to the inputs of inverting amplifiers 29–35, respectively. The inverters 29–35 together with NAND circuits 39–44 and inverting amplifiers 49–54 are used to develop indications of the number of zeros preceding the most significant nonzero bit. If the most significant bit is "0" (a zero signal on terminal $i_{15}$), this is indicated by a "1" at the output of inverter 35. The output of inverters 34 and 35 are connected to the inputs of NAND circuit 44 which in turn is connected to inverter 54. If the two most significant bits of the incoming word are both "0" (a zero at terminals $i_{15}$ and $i_{14}$), this condition is indicated by a "1" at the output of inverter 54. In similar fashion outputs of inverters 33 and 54 are coupled to inverter 53 via NAND circuit 43 to indicate when the three most significant bits are all "0"; the outputs of inverters 32 and 53 are coupled to inverter 52 via NAND circuit 42 to indicate when the four most significant bits are "0"; inverters 31 and 52 are coupled to inverter 51 via NAND circuit 41 to indicate when the 5 most significant bits are all "0"; inverters 30 and 51 are coupled to inverter 50 via NAND circuit 40 to indicate when the 6 most significant bits are all "0"; inverters 29 and 50 are coupled to inverter 49 via NAND circuit 39 to indicate when the 7 most significant bits are all "0".

Input terminal $i_{15}$ is directly connected to output terminal $M_a$ and, therefore, a "1" appears at the output terminal when the most significant bit of the incoming word is "1". The output of inverter 35 is connected to one input of NAND circuit 65, terminal $i_{14}$ is directly connected to the other input of NAND circuit 65 and the output of the NAND circuit is connected to terminal $M_b$ via inverter amplifier 75. If the signal on terminal $i_{14}$ is a "1" and the more significant bit is "0" as indicated by a signal at the output of inverter 35, then a "1" appears at output terminal $M_b$. NAND circuits 64–60 receive input signals directly from terminals $i_{13}$–$i_9$ and inverters 54–50, respectively. These NAND circuits are coupled to output terminals $M_c$ through $M_g$ via inverter amplifiers 74–70, respectively. If a "1" appears on terminal $i_{13}$ and the more significant bits are "0" as indicated by the signal at the output of inverter 54, a "1" appears at terminal $M_c$; if a "1" appears at terminal $i_{12}$ and the more significant bits are "0" as indicated by a signal at the output of inverter 53, a "1" appears at terminal $M_d$; if terminal $i_{11}$ is "1" and all the more significant bits are zero as indicated by a signal at the output of inverter 52, a "1" appears at terminal $M_e$; if a "1" appears at terminal $i_{10}$ and all the more significant bits are zero as indicated by a signal at the output of inverter 51, a "1" appears at output terminal $M_f$; and if a "1" appears at terminal $i_9$ and all the more significant bits are zero as indicated at inverter 50, a "1" appears at output terminal $M_g$. The output of inverter 49 is directly connected to output terminal $M_h$ and provides a "1" on this output terminal whenever the 7 most significant bits of the incoming word are all zero.

The logic in FIG. 2 is mutually exclusive so that one and only one of the output terminals $M_a$ through $M_h$ can be activated at any one time. If one of the 7 most significant bits is "1", the active terminal $M_a$–$M_g$ will indicate the location of the most significant nonzero bits. If all the 7 most significant bits are zero, then terminal $M_h$ becomes active indicating that the most significant nonzero bit is either the 8th or a lesser significant bit.

Figure 3:
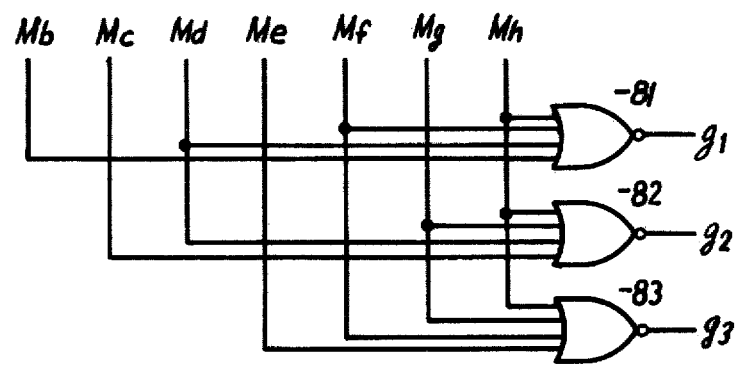
FIG. 3 is a schematic diagram of logic circuitry for providing gain coding in the encoding processor.

The gain encoder circuit E is schematically illustrated in FIG. 3 and is in the form of an octal to binary converter including 3 NOR circuits 81-83 which are connected to output terminals $g_1$, $g_2$, and $g_3$. The terminals $M_b$, $M_d$, $M_f$ and $M_h$ are connected to the four inputs of NOR circuit 81; terminals $M_c$, $M_d$, $M_g$, and $M_h$ are connected to the inputs of NOR circuit 82; and terminals $M_e$, $M_f$, $M_g$ and $M_h$ are connected to the inputs of NOR circuit 83.

Figures 4A, 4B, 5:
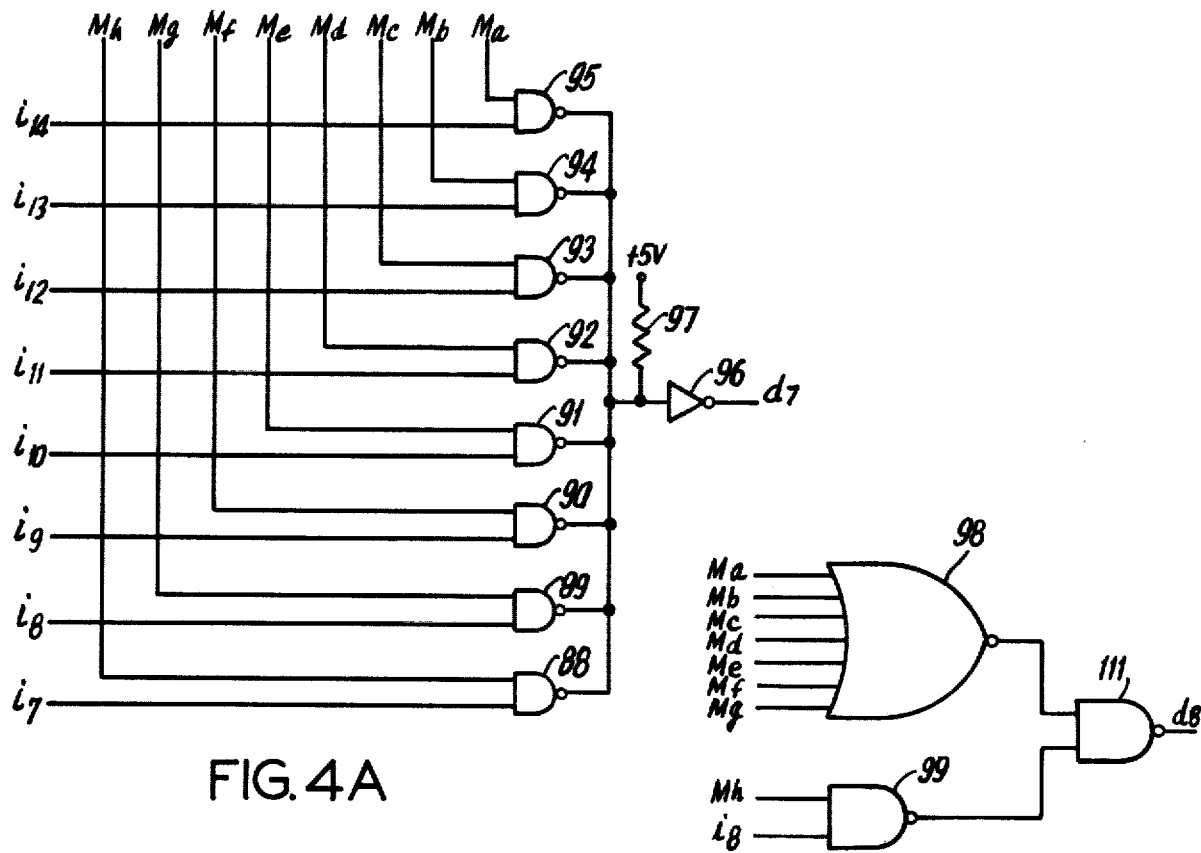
FIG. 4A is a schematic diagram of logic circuitry for performing output gating functions for the lesser encoded data bits and FIG. 4B is a schematic diagram of logic circuitry for performing output gating for the most significant encoded data bit.
FIG. 5 is a table setting forth the encoding scheme for converting 15 bit incoming words into an 11 bit format including a three bit gain code and eight data bits.

The gain bit encoding is in accordance with the truth table appearing in the columns of FIG. 5 under the headings $g_1$, $g_2$, and $g_3$. Thus, for example, if $M_h$ is the active terminal, a "0" appears at each of the output terminals $g_1$, $g_2$, and $g_3$ because the terminal $M_h$ is coupled to the inputs of each NOR circuit 81, 82, and 83. As another example, assume that terminal $M_e$ is the active terminal in which case a "1" will appear at terminals $g_1$ and $g_2$ and a "0" will appear at terminal $g_3$ since input terminal $M_e$ is connected solely to the input of NOR circuit 83.

The "gain multiplier" in FIG. 5 is the decimal equivalent of the gain code $g_1$-$g_3$ and can be defined:

True Value = (gain multiplier) × (summation of encoded data bits).

The output gating circuits F of the encoding processor for the lesser encoded data bits consists of 7 sets of NAND gates, each set being similar to that shown in FIG. 4A for encoded data bit $d_7$. The outputs of NAND gates 88-95 are each connected to an output terminal $d_7$ via an inverting amplifier 96, the common junction of the NAND circuit outputs also being connected to a +5 volt source via a biasing resistor 97 which permits NAND gates 88-95 to provide an OR function for inverter logic. One input of each of the NAND gates 88-95 is connected, respectively, to one of the terminals $i_7$ through $i_{14}$. The other inputs of the NAND gates 95-88 are connected, respectively, to one of the terminals $M_a$-$M_h$.

In operation, the active one of the terminals $M_a$-$M_h$ conditions the corresponding NAND gate so that a selective one of the incoming bits passes through to terminal $d_7$. For example, if the most significant incoming bit is a "1", then terminal $M_a$ is activated by MSB detector C and, therefore, the signal at terminal $i_{14}$ passes through gate 95 and appears as the second most significant data bit on terminal $d_7$. As another example, if the two most significant incoming bits are both zero and the third most significant bit is not zero, than terminal $M_c$ is activated by the MSB detector and the logic state which appears at terminal $i_{12}$ passes through gate 94 to appear as the second most significant output data bit on terminal $d_7$.

A similar set of gates is connected to output terminal $d_6$ except, that in this case, the input terminals connect to terminals $i_{13}$-$i_6$ instead of $i_{14}$-$i_7$. Likewise, a similar set of gates with input terminals connected to $i_{12}$-$i_5$ is connected to output terminal $d_5$; a similar set of gates with input terminals connected to $i_{11}$-$i_4$ is connected to output terminal $d_4$; a similar set of gates with input terminals connected to $i_{10}$-$i_3$ is connected to output terminal $d_3$; a similar set of gates with input terminals connected to $i_9$-$i_2$ is connected to output terminal $d_2$; a similar set of gates with input terminals connected to $i_8$-$i_1$ is connected to output terminal $d_1$.

The logic circuitry for obtaining the most significant encoded bit $d_8$ is illustrated in FIG. 4B. Since the encoding operation removes zeros preceding the most significant nonzero data bit, the most significant encoded data bit is usually a "1". More specifically, if there are six or less zeros preceding the most significant incoming data bit (the condition corresponding to $M_a$-$M_g$) the most significant encoded data bit $d_8$ is "1". If there are seven zeros preceding the most significant nonzero bit (the condition corresponding to $M_h$ when $i_8$ is "1") the most significant encoded bit $d_8$ is also a "1". If there are eight or more zeros preceding the most significant nonzero bit (the condition corresponding to $M_h$ when $i_8$ is "0"), the most significant encoded $d_8$ bit is a "0".

As shown in FIG. 4B, terminals $M_a$-$M_g$ are connected to the seven inputs of a NOR circuit 98 to detect when six or less zeros precede the most significant incoming bit. Terminals $M_h$ and $i_8$ are connected to the inputs of a two input NAND circuit 99 to detect the condition where seven zeros precede the most significant incoming bit. The outputs of circuits 98 and 99 are coupled to terminal $d_8$ via a NAND circuit 111 which, because of the inverted logic, provides an OR function.

If a "1" appears on any one of terminals $M_a$-$M_g$, a "0" appears at the output of NOR circuit 98 which in turn causes NAND circuit 111 to produce a "1" at terminal $d_8$. If a "1" appears at both of terminals $M_h$ and $i_8$, NAND circuit 99 produces a "0" at its output which in turn causes NAND circuit 111 to produce a "1" at terminal $d_8$. Thus, a "1" appears at terminal $d_8$ whenever seven or less zeros precede the most significant nonzero incoming data bit, and a "0" appears whenever eight or more zeros precede the most significant nonzero bit.

The table in FIG. 5, under the heading "Data Bits" indicates which incoming bits are transferred to the output under various conditions. If, for example, the most significant incoming bit is a "1", then the MSB detector C activates terminal $M_a$ and the most significant incoming bit $i_{15}$ becomes the most significant data bit ($d_8$) and $i_8$ becomes the least significant data bit ($d_1$). Thus, when terminal $M_a$ is active, the eight most significant incoming bits $i_{15}$-$i_8$ are transferred to the output and become the eight data bits $d_8$-$d_1$.

To take another example, if $i_{14}$ is the most significant nonzero incoming bit, then the MSB detector activates terminal $M_b$ and the gates transfer the incoming bits $i_{14}$-$i_7$ to the output data bit terminals. Likewise, if, for example, the most significant nonzero bit is preceded by four zeros in the incoming word, terminal $M_e$ is activated and the incoming bits $i_4$-$i_{11}$ become the output data bits $d_1$-$d_8$.

Figures 6, 7:
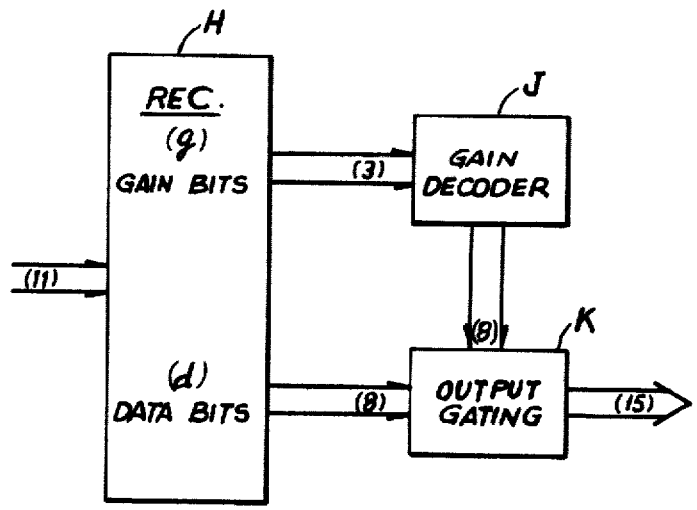
FIG. 6 is a diagram illustrating conversion of a 15 bit word into the 11 bit format.
FIG. 7 is a block diagram illustrating a parallel digital decoding processor according to the invention.

FIG. 6 illustrates the operation with respect to a 15 bit incoming word 101001110100000. Since the five most significant bits (appearing on the right) are zero and $i_{10}$ is the most significant nonzero bit, the only true expression in the algorithm for the MSB detector is:

$$M_f = \bar{a} + \bar{b} + \bar{c} + \bar{d} + \bar{e} + f$$

Accordingly, the MSB detector activates the terminal $M_f$.

When $M_f$ is active, gain encoder E provides the gain code designations 010 which become the gain code bits $g_1$, $g_2$ and $g_3$ of the output word. Also, when terminal $M_f$ is active, the incoming bits $i_3$-$i_{10}$ are transferred to the output by the gating circuits F to become the data bits $d_1$-$d_8$ respectively of the encoded word. The 11 bit encoded word consisting of eight data bits followed by three gain code bits is:

10011101010

In many cases, the system which further processes the data can be designed to use data in the 11 bit format including the three gain code bits and the eight data bits. However, where desired, the data can be reconverted into a 15 bit format by apparatus shown in FIG. 7. The receiver unit H receives the 11 bit word and is connected to supply the three gain code bits to a gain decoder J. The gain decoder is a binary to octal converter and activates one of eight separate lines connected to an output gating unit K. The output gating circuits transfer the eight data bits to the correct set of output terminals in accordance with the gain indication received from the gain decoder J. This operation has the effect of adding zeros before and after the data bits to thereby fill out a 15 bit word.

The reconstructed 15 bit word is not identical to the original 15 bit word prior to encoding since resolution beyond eight data bits is lost. However, as a practical matter, resolution greater than provided by the eight data bits is often beyond the capability of the measuring instrumentation and, hence the loss is not significant.

Figure 8:
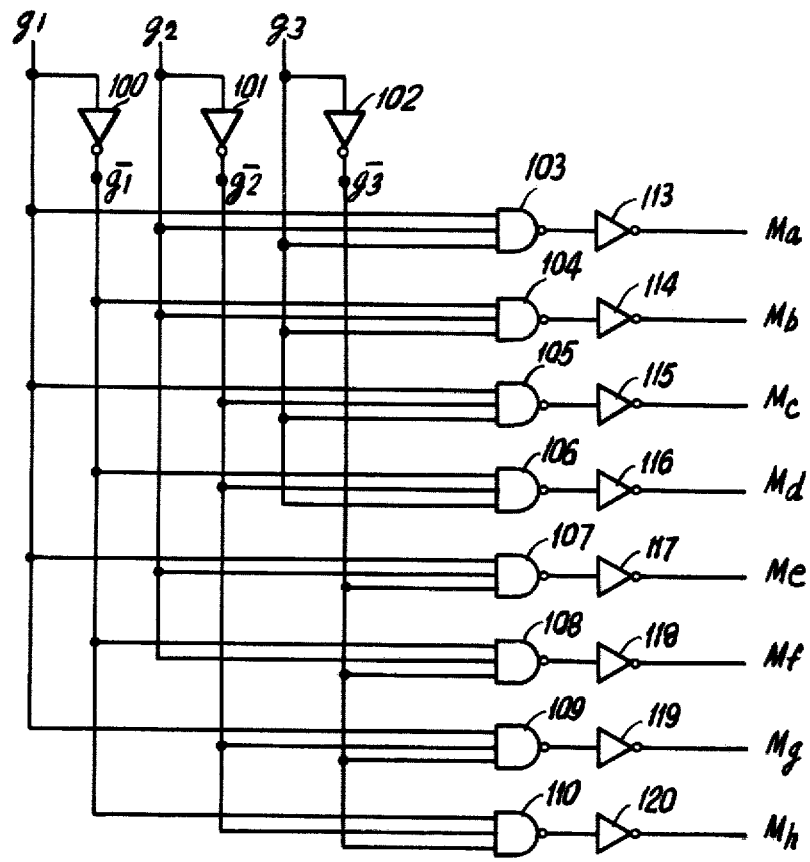
FIG. 8 is a schematic diagram of logic circuitry for providing gain decoding.

The gain decoder H is shown schematically in FIG. 8 and is arranged to activate a selected one of the eight output lines $M_a$–$M_h$ in accordance with the three gain code bits applied to the input terminals $g_1$–$g_3$.

The terminals $g_1$, $g_2$, and $g_3$ are coupled to terminals $\bar{g}_1$, $\bar{g}_2$ and $\bar{g}_3$ via inverting amplifiers 100–102, respectively. Thus, the complements of the gain code bits appear at the outputs of the inverters 100–102.

Terminals $g_1$, $g_2$ and $g_3$ are connected to the inputs of a NAND circuit 103, the output of which is coupled to terminal $M_a$ via an inverting amplifier 113; terminals $\bar{g}_1$, $g_2$ and $g_3$ are connected to the inputs of a NAND circuit 104, the output of which is coupled to terminal $M_b$ via inverting amplifier 114; terminals $g_1$, $\bar{g}_2$ and $g_3$ are connected to the inputs of a NAND circuit 105, the output of which is coupled to terminal $M_c$ via an inverting amplifier 115; terminals $\bar{g}_1$, $\bar{g}_2$ and $g_3$ are connected to the inputs of a NAND circuit 106, the output of which is coupled to terminal $M_d$ via an inverting amplifier 116; terminals $g_1$, $g_2$ and $\bar{g}_3$ are connected to the inputs of a NAND circuit 107, the output of which is coupled to terminal $M_e$ via an inverting amplifier 117; terminals $\bar{g}_1$, $g_2$ and $\bar{g}_3$ are connected to the inputs of a NAND circuit 108, the output of which is coupled to terminal $M_f$ via an inverting amplifier 118; terminals $g_1$, $\bar{g}_2$ and $\bar{g}_3$ are connected to the inputs of a NAND circuit 109, the output of which is coupled to terminal $M_g$ via an inverting amplifier 119; and terminals $\bar{g}_1$, $\bar{g}_2$ and $\bar{g}_3$ are connected to the inputs of a NAND circuit 110, the output of which is coupled to terminal $M_h$ via an inverting amplifier 120.

Thus, each of the gates 103–110 responds to a different combination of the three gain code bits applied to terminals $g_1$–$g_3$ and, therefore, a different one of the output lines $M_a$–$M_h$ is selected for each of the possible combinations of the three bit gain code.

Figure 9A:
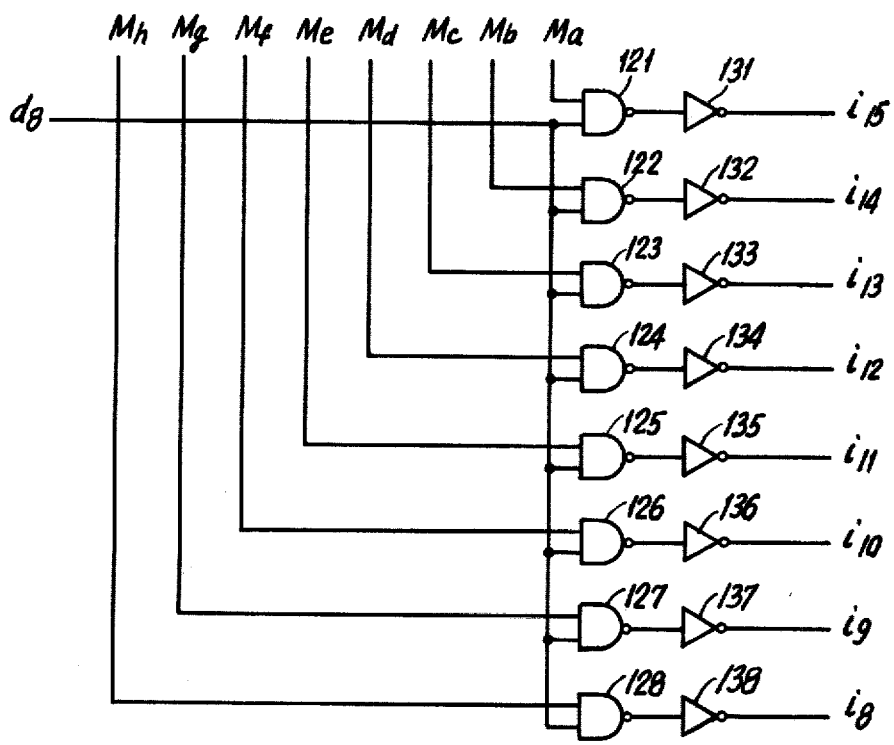
FIG. 9A is a schematic diagram for one section of logic circuitry for output gating in decoding processor and FIG. 9B is a schematic diagram showing the complete output gating arrangement.

One section of the output gating circuits is illustrated schematically in FIG. 9A. The complete output gating arrangement would include eight such sets of gates, interconnected as shown in FIG. 9B, one set for each of the eight data bits.

The terminals $M_1$–$M_h$ are each connected to an input of one of the NAND circuits 121–128, respectively, the other input from each of the NAND circuits being connected to the terminal $d_8$. The outputs of NAND circuits 121–128 are coupled, respectively, to output terminals $i_{15}$–$i_8$ via inverting amplifiers 131–138. Thus, data bit $d_8$ is routed to a selected one of the terminals $i_{15}$–$i_8$ depending on which one of terminals $M_a$–$M_h$ is activated by the gain decoder.

Figure 9B:
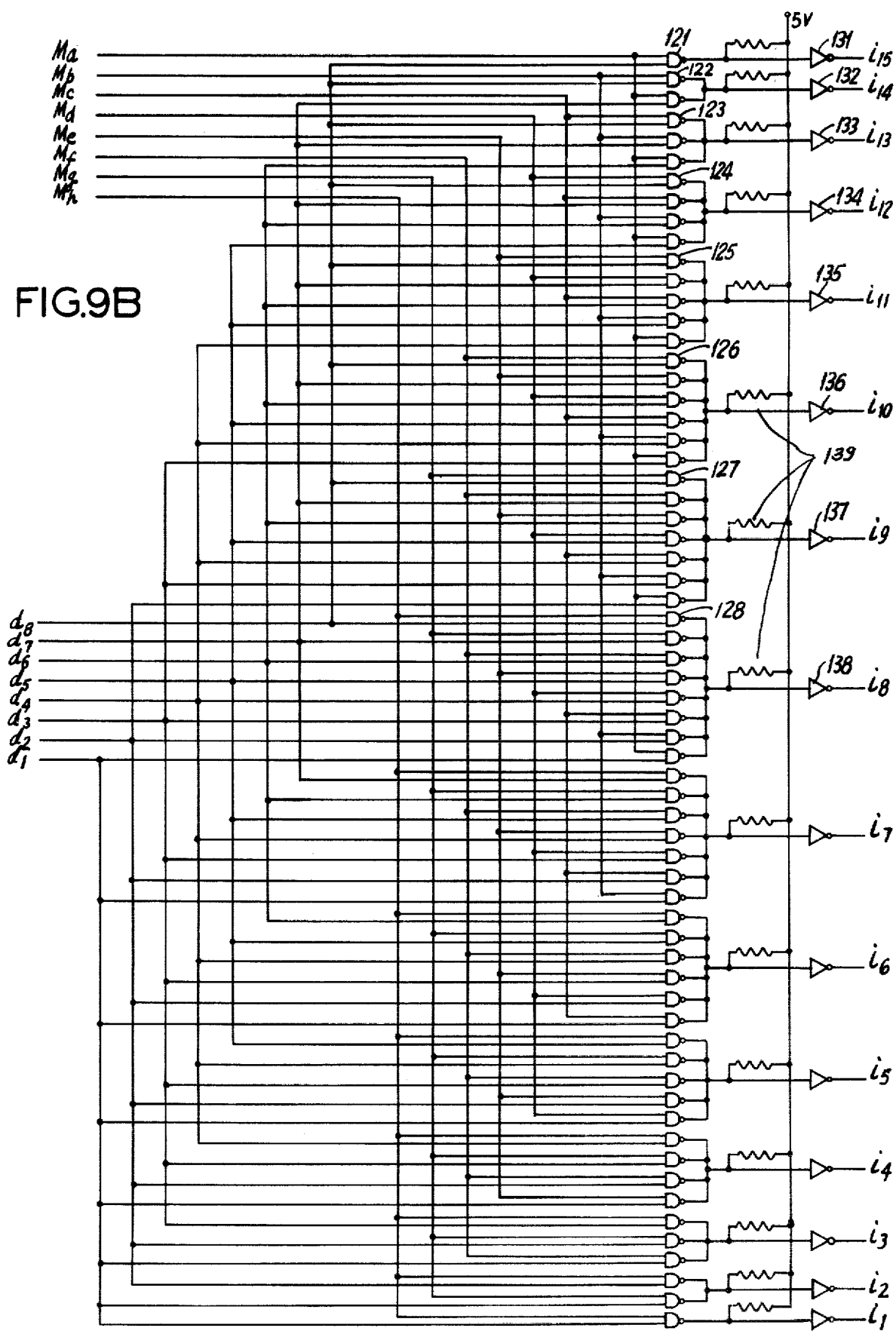

Each of the other data bits is coupled to the output terminals via a similar set of gates as shown in FIG. 9B. The gates for data bit $d_7$ are coupled to terminals $i_{14}$–$i_7$; the gates for data bit $d_6$ are coupled to terminals $i_{13}$–$i_6$; the gates for data bit $d_5$ are coupled to terminals $i_{12}$–$i_5$; the gates for data bit $d_4$ are coupled to terminals $i_{11}$–$i_4$; the gates for data bit $d_3$ are coupled to terminals $i_{10}$–$i_3$; the gates for data bit $d_2$ are coupled to terminals $i_9$–$i_2$; and the gates for data bit $d_1$ are coupled to terminals $i_8$–$i_1$. The bias resistors 139 are used to provide an OR function with respect to signals from several NAND circuits coupled to a common output terminal.

Thus, when one of the terminals $M_a$–$M_h$ is activated, one gate in each set of gates is conditioned and each data bit is thus transferred to a selected one of output terminals $i_{15}$–$i_1$. The eight data bits appear on eight adjacent terminals. A "0" will appear on the remaining output terminals to thereby fill in the 15 bit word.

As can be seen in examining FIG. 6 there is some redundancy in the encoded signals according to the system heretofore described. The gain code indicates the location of the most significant "1" bit and data bit $d_8$ also indicates the presence of the same "1" bit. Therefore, for the example shown in FIG. 6, if data bit $d_8$ were simply eliminated, the same intelligence could be transmitted in the encoded word.

Figures 10, 11:
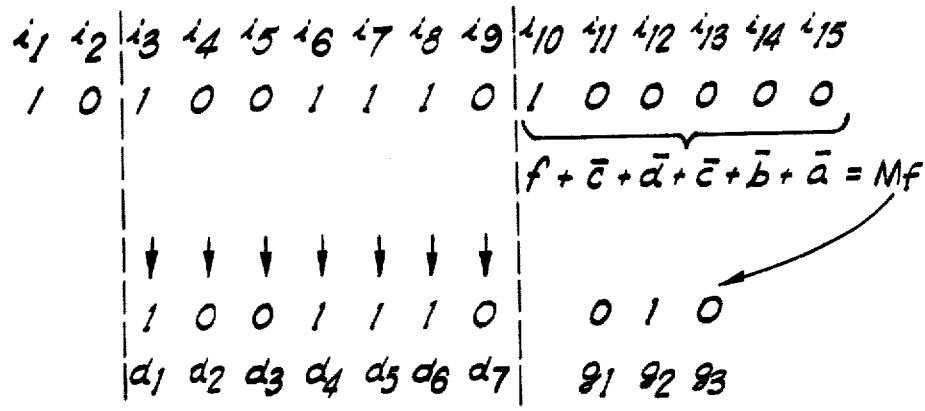
FIG. 10 is a diagram illustrating conversion of a 15 bit word into a ten bit format.
FIG. 11 is a table setting forth the encoding and decoding scheme for 15 bit words and a 10 bit encoded format.

As shown in FIG. 10 the encoding can be achieved with a ten bit encoded word (instead of eleven bits in FIG. 6) including data bits $d_1$ through $d_7$ corresponding to incoming bits $i_3$ through $i_9$ plus the three bit gain code. Thus, the incoming word 101001110100000 becomes the ten bit encoded word 1001110010.

The gain codes $M_a$ through $M_g$ each indicate the location of the most significant "1" bit. Thus, when these gain codes are present the data bit $d_8$ can be eliminated and decoding of the gain code can later be used to correctly place the most significant "1" bit in the decoded word.

Elimination of data bit $d_8$ however creates an ambiguity for small numbers wherein eight or more of the most significant incoming bits are zero, i.e., those incoming numbers corresponding to gain code $M_h$. This is the one case in which the gain code does not indicate the location of the most significant "1" bit and it is therefore encoded somewhat differently in the ten bit format. In this case the seven incoming bits immediately following the eliminated zero bits are encoded.

The hardware for the ten bit encoding scheme is basically the same as shown in FIG. 1 except that the output gates F select only seven bits to include as data bits in the ten bit encoded word transmitted by transmitter G.

The most significant bit detector is the same as illustrated in FIG. 2. The gain code (FIG. 11) is also the same and, hence, the gain code encoder illustrated in FIG. 3 is the same. However, as shown in FIG. 11 only seven data bits are encoded.

As indicated in FIG. 11 incoming bits $i_8$ through $i_{14}$ are encoded as data bits $d_1$ through $d_7$ for gain code $M_a$ whereas for gain code $M_b$ incoming bits $i_7$ through $i_{13}$ are encoded, for gain code $M_c$ incoming bits $i_6$ through $i_{12}$ are encoded, for gain code $M_d$ incoming bits $i_5$ through $i_{11}$ are encoded, for gain code $M_e$ incoming bits $i_4$ through $i_{10}$ are encoded, for gain code $M_f$ incoming bits $i_3$ through $i_9$ are encoded, for gain code $M_g$ incoming bits $i_2$ through $i_8$ are encoded, for gain code $M_h$ incoming bits $i_2$ through $i_8$ are encoded.

In comparing the encoding scheme in FIG. 11 to that in FIG. 6 it should be noted that the ten bit encoding scheme of FIG. 11 has, in effect, eliminated data bit $d_8$ for gain codes $M_a$ through $M_g$ and has eliminated data bit $d_1$, for gain code $M_h$. In the ten bit arrangement the same group of incoming bits $i_2$ through $i_8$ are encoded for gain codes $M_g$ and $M_h$.

Figure 12:
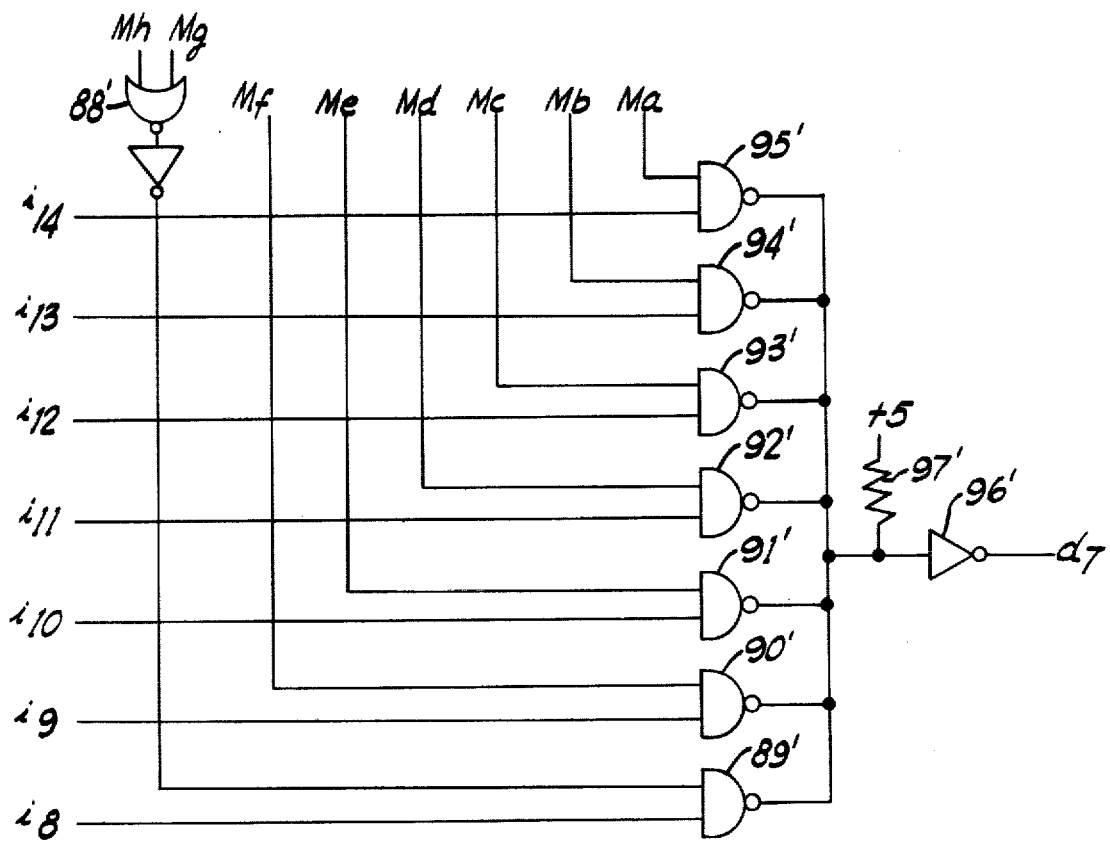
FIG. 12 is a schematic diagram of logic circuitry for performing output gating functions for conversion to the 10 bit encoded format.

In the hardware for the data bit encoding, the encoding circuit for data bit $d_8$ (FIG. 4B) is eliminated. The encoding circuit for data bit $d_7$ is modified slightly as shown in FIG. 12. The gain code signals $M_a$–$M_f$ are applied to one of the inputs, respectively, of NAND circuits 95′–90′. Gain code signals $M_g$ and $M_h$ are applied to the inputs of a NOR circuit 88′ and the output of the NOR circuit is connected to one input of NAND circuit 89′ via an inverting amplifier. Incoming bit signals $i_{14}$ through $i_8$ are connected, respectively, to the other inputs to NAND circuits 95′–89′, the common output of NAND circuits 89′–95′ being connected to a biasing 97′ and to terminal $d_7$ via an inverting amplifier 96′. With this arrangement the active one of terminals $M_a$ through $M_h$ determines which of the lines $i_{14}$–$i_8$ controls the state of terminal $d_7$.

Figure 13:
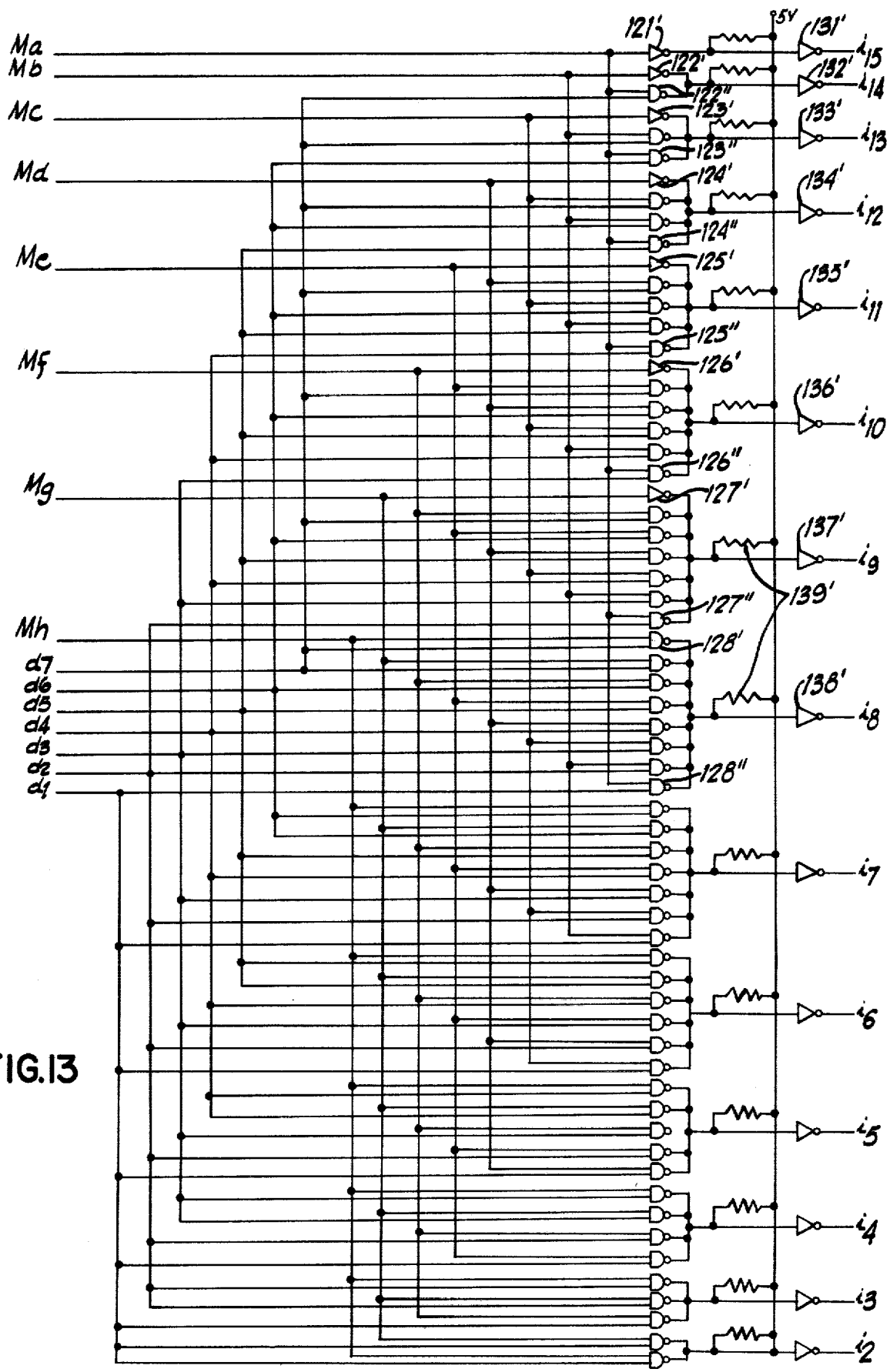
FIG. 13 is a schematic diagram showing a portion of the output gating in the decoding processor for the 10 bit format.

The encoding circuits for data bits $d_6$ through $d_1$ are the same as shown in FIG. 12 except that for data bit $d_6$ the incoming connections are to lines $i_{13}$ to $i_7$ for data bit $d_5$ the incoming connections are line $i_{12}$ to $i_6$ for data bit $d_4$ the incoming connections are to lines $i_{11}$ to $i_5$ for data bit $d_3$ the incoming connections are to lines $i_{10}$ to $i_4$ for data bit $d_2$ the incoming connections are to lines $i_9$ to $i_3$ for data bit $d_1$ the incoming connections are to lines $i_8$ to $i_2$ Decoding for the ten bit scheme is achieved using the same basic arrangement shown in the block diagram FIG. 7 and the same gain decoder illustrated in FIG. 8. The output gating circuits are modified as shown in FIG. 13 so that the most significant "1" bits for most decoded numbers are derived from the gain code rather than data bit $d_8$.

The gain code lines $M_a$ through $M_g$ are connected to output lines $i_{15}$ through $i_9$, respectively, via inverting amplifiers 121′–127′ and 131′–137′. Thus, when code $M_a$ is decoded, terminal $i_{15}$ is activated via amplifiers 121′ and 131′ to automatically insert a "1". Likewise, gain code $M_b$ causes a "1" to appear on output terminal $i_{14}$ via amplifiers 122′ and 132′, gain code $M_c$ causes a "1" to appear on output terminal $i_{13}$ via amplifiers 123′ and 133′ etc. It is in this fashion that the gain code is used to automatically insert the most significant "1" at the appropriate location in the decoded word.

The data bits $d_1$ through $d_7$ are gated to the appropriate output terminals $i_2$ through $i_{14}$ in accordance with the gain code. For example, the terminals receiving data bits $d_7$–$d_1$ are connected, respectively, to inputs of NAND circuits 122″–128″ with the other input to each of these NAND circuits being connected to the terminal that receives gain code signal $M_a$. As a result, when gain code $M_a$ is detected, NAND circuits 122″–128″ are conditioned to transfer data bits $d_7$–$d_1$ to output terminals $i_{14}$–$i_8$ respectively. In similar fashion:

gain code $M_b$ transfers the data bits to terminals $i_{13}$–$i_7$;
gain code $M_c$ transfers the data bits to terminals $i_{12}$–$i_6$;
gain code $M_d$ transfers the data bits to terminals $i_{11}$–$i_5$;
gain code $M_e$ transfers the data bits to terminals $i_{10}$–$i_4$;
gain code $M_f$ transfers the data bits to terminals $i_9$–$i_3$;
gain code $M_g$ transfers the data bits to terminals $i_8$–$i_2$;
gain code $M_h$ transfers the data bits to terminals $i_8$–$i_2$.

The system according to the invention not only provides a compact encoding scheme but also permits extremely high speed encoding and decoding which becomes particularly important for digital television and telephone operation or other real time analog/digital operations. This is because the system operates with very few successive logic operations. It should be noted that the MSB detector shown in FIG. 2 has been designed for a minimum number of components but where still faster encoding speeds are desired the MSB can be modified to avoid the chain of successive operations via amplifiers 35, 54, 53, 52, 52, 51, 49 and NAND circuits 44, 43, 42, 41, 40, 39.

Figure 14:
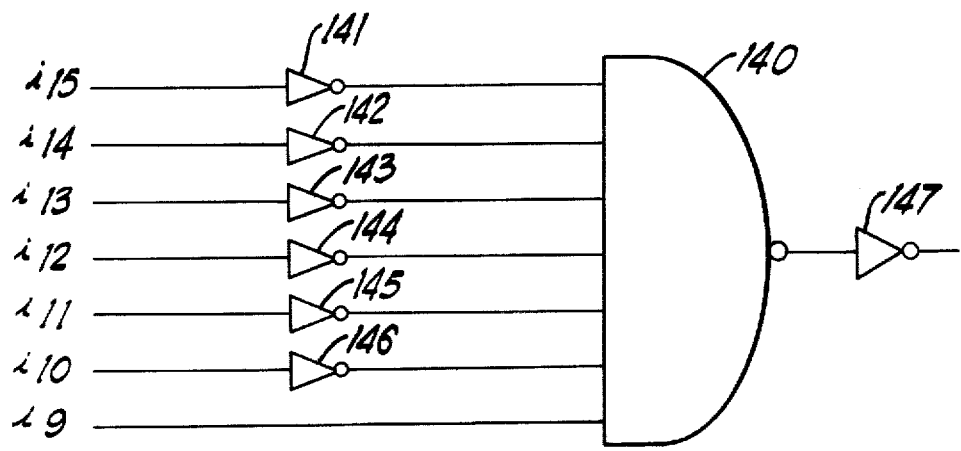
FIG. 14 is a schematic diagram of one section of a fast MSB detector.

For example, as shown in FIG. 14, the gain code signal $M_g$ could be obtained using a seven input NAND gate 140. The input terminals $i_{15}$–$i_{10}$ are connected to separate inputs of NAND gate 140 via inverting amplifiers 141–146, respectively, and input terminal $i_9$ is connected to the remaining terminal of the NAND gate. The output of the NAND gate is connected to terminal $M_g$ via an inverting amplifier 147. Other gain code signals could similarly be obtained using multiple input NAND gates connected in accordance with the logic indications for the gain codes as shown in FIG. 2.

While only a few specific embodiments have been illustrated in detail, it should be obvious to those skilled in the art that there are many variations within the scope of the present invention. The invention is more specifically defined in the appended claims.

What is claimed is:

1. An apparatus for digital code compression whereby certain zero bits of an incoming word having i data bits are eliminated comprising:

(a) input means for receiving said incoming word;

(b) most significant bit detector means coupled to said input means for receiving the r − 1 most significant incoming data bits and for determining whether the most significant nonzero bit is among said r − 1 most significant incoming data bits, and if so, the location of said most significant nonzero bit and producing a one out of r − 1 signal;

(c) gain encoder means coupled to said most significant bit detector means and receiving said one out of r − 1 signal for converting it to an n bit digital signal indicative of the number of zero bits included in said r − 1 most significant incoming data bits, to be eliminated in said code compression;

(d) data bit selector means coupled to said input means and said most significant bit detector means and receiving said one out of r − 1 signal for selecting m bits from said incoming word, said m bits consisting of said most significant nonzero bit and the m − 1 next lesser significant bits when said most significant nonzero bit is one of said r−1 incoming data bits, said m bits consisting of the $r^{th}$ most significant incoming data bit and the m−1 next lesser significant data bits when said most significant nonzero bit is said $r^{th}$ or a lesser significant data bit; and (e) output circuit means coupled to said gain encoder means and said data bit selector means for providing at its output an encoded word including said n bit digital signal and said m data bits;

said most significant bit detector being a parallel logic circuit constructed to provide $M_a$-$M_r$ indicators of the nonzero bit location:

$$M_a = a$$
$$M_b = \bar{a} + b$$
$$M_c = \bar{a} + \bar{b} + c$$
$$M_r - 1 = \bar{a} + \bar{b} + \bar{c} - r - 1$$
$$M_r = \bar{a} + \bar{b} + \bar{c} - r - 1$$

wherein a is the most significant bit of said incoming word, b, c-r are successively lesser bits, and $r = 2^n$.

2. Apparatus for digital code compression according to claim 1 wherein n=3 and said gain encoder means is a parallel logic circuit constructed to encode as follows:

$$M_a = 111$$
$$M_b = 011$$
$$M_c = 101$$
$$M_d = 001$$
$$M_e = 110$$
$$M_f = 010$$
$$M_g = 100$$
$$M_h = 000.$$

3. Apparatus for digital code compression according to claim 1 wherein each of said indicators $M_a$-$M_r$ is provided by a separate multiple input NAND gate.

4. An apparatus for digital code compression whereby certain zero bits of an incoming word having i data bits are eliminated comprising:

(a) input means for receiving said incoming word;

(b) most significant bit detector means coupled to said input means for receiving the r−1 most significant incoming data bits and for determining whether the most significant nonzero bit is among said r−1 most significant incoming data bits, and if so, the location of said most significant nonzero bit and producing a one out of r−1 signal;

(c) gain encoder means coupled to said most significant bit detector means receiving said one out of r−1 signal for converting it to an n bit digital signal indicative of the number of zero bits, included in said r−1 most significant incoming data bits, to be eliminated in said code compression;

(d) data bit selector means coupled to said input means and said most significant bit detector means and receiving said one out of r−1 signal for selecting m bits from said incoming word, said m bits consisting of the m next lesser significant bits following said most significant nonzero bit when said most significant nonzero bit is one of said r−1 incoming data bits, said m bits consisting of the $r^{th}$ most significant incoming data bit and the m−1 next lesser significant data bits when said most significant nonzero bit is said $r^{th}$ or a lesser significant data bit; and (e) output circuit means coupled to said gain encoder means and said data bit selector means for providing at its output an encoded word including said n bit digital signal and said m data bits;

said most significant bit detecter being a parallel logic circuit constructed to provide $M_a$-$M_r$ indicators of the nonzero bit location:

$$M_a = a$$
$$M_b = \bar{a} + b$$
$$M_c = \bar{a} + \bar{b} + c$$
$$M_r - 1 = \bar{a} + \bar{b} + \bar{c} - r - 1$$
$$M_r = \bar{a} + \bar{b} + \bar{c} - r - 1$$

wherein a is the most significant bit of said incoming word, b, c-r are successively lesser bits, and $r = 2^n$.

* * * * *